United States Patent
Song et al.

(10) Patent No.: US 7,489,035 B2
(45) Date of Patent: Feb. 10, 2009

(54) INTEGRATED CIRCUIT CHIP PACKAGE HAVING A RING-SHAPED SILICON DECOUPLING CAPACITOR

(75) Inventors: Eun-Seok Song, Gyeonggi-do (KR); Hee-Seok Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 462 days.

(21) Appl. No.: 11/258,672

(22) Filed: Oct. 25, 2005

(65) Prior Publication Data
US 2006/0097365 A1  May 11, 2006

(30) Foreign Application Priority Data
Nov. 9, 2004  (KR) ...................... 10-2004-0090669

(51) Int. Cl.
*H01L 23/34* (2006.01)
(52) U.S. Cl. .................. 257/724; 257/532; 257/784; 257/786; 257/E27.045; 257/E27.048; 361/763; 361/766; 361/734
(58) Field of Classification Search ......... 257/296–313, 257/528, 531, 532, 533, 596–602, 666–733, 257/780, 784, 923, 924, E27.016, E27.017, 257/E27.019, E27.021, E27.023–E27.025, 257/E27.03–E27.035, E27.037–E27.038, 257/E27.041–E27.045, E27.047, E27.048, 257/E27.071, E27.09, E27.092, E27.093, 257/E27.095, E27.101, E27.114–E27.116; 438/171, 190, 210, 238, 253, 329, 378, 387, 438/444, 901; 361/723, 766, 767, 773, 776, 361/813
See application file for complete search history.

(56) References Cited
U.S. PATENT DOCUMENTS

| 4,945,399 A | 7/1990 | Brown et al. |
| 5,323,060 A | 6/1994 | Fogal et al. |

(Continued)

FOREIGN PATENT DOCUMENTS

JP  06-310649  11/1994

(Continued)

OTHER PUBLICATIONS

English language abstract of Korean Publication 1990-012354.

(Continued)

*Primary Examiner*—Jasmine J Clark
(74) *Attorney, Agent, or Firm*—Marger Johnson & McCollom, P.C.

(57) ABSTRACT

A semiconductor package features a ring-shaped silicon decoupling capacitor that reduces simultaneous switching noise. The decoupling capacitor is fabricated on a substrate from silicon using a wafer fabrication process and takes the form of an annular capacitive structure that extends around a periphery of a substrate-mounted integrated circuit (IC). The decoupling capacitor has a reduced thickness on or below a chip level and takes the place of a conventional power/ground ring. Therefore, the decoupling capacitor can be disposed within the package without increasing the thickness and the size of the package. The decoupling capacitor may be coupled to various power pins, allowing optimum wire bonding, shortened electrical connections, and reduced inductance. Bonding wires connected to the decoupling capacitor have higher specific resistance, lowering the peak of the resonance frequency and thereby reducing simultaneous switching noise.

29 Claims, 8 Drawing Sheets

U.S. PATENT DOCUMENTS

| | | | |
|---|---|---|---|
| 6,222,275 B1 * | 4/2001 | Keeth | 257/776 |
| 6,320,757 B1 * | 11/2001 | Liu | 361/760 |
| 6,608,376 B1 | 8/2003 | Liew et al. | |
| 6,937,477 B2 * | 8/2005 | Wu | 361/760 |

FOREIGN PATENT DOCUMENTS

| | | |
|---|---|---|
| JP | 08-017960 | 1/1996 |
| KR | 1990-012354 | 8/1990 |
| KR | 2003-0093036 | 12/2003 |

OTHER PUBLICATIONS

English language abstract of Korean Publication 2003-0093036.
English language abstract of Japanese Publication No. 06-310649.
English language abstract of Japanese Publication No. 08-017960.
Patrik Larsson, "Resonance and Damping in CMOS Circuits with On-Chip Decoupling Capacitance", IEEE Transactions on Circuits and System vol. 45, No. 8, 1998. p. 849-858.

* cited by examiner

INTEGRATED CIRCUIT CHIP PACKAGE HAVING A RING-SHAPED SILICON DECOUPLING CAPACITOR

CROSS REFERENCE TO RELATED APPLICATIONS

This U.S. non-provisional application claims priority under 35 U.S.C. §119 from Korean Patent Application No. 2004-90669, which was filed in the Korean Intellectual Property Office on Nov. 9, 2004, the contents of which are incorporated by reference herein in its entirety.

BACKGROUND

1. Field of the Invention

The present invention relates generally to semiconductor package technology and, more particularly, to an integrated circuit chip package having a decoupling capacitor disposed therein so as to reduce simultaneous switching noise.

2. Description of the Related Art

The rapid and continuing advances in integrated circuit (IC) technology have resulted in many new challenges to the interconnection package design. The number of devices that has been integrated on a single chip is dramatically increased, while the devices are becoming more sensitive to the power-ground noise.

When multiple output drivers switch simultaneously, they induce a voltage drop in the chip/package power distribution. Simultaneous switching momentarily raises the ground voltage within the device relative to the system ground. This shift in the ground potential to a non-zero value is known as simultaneous switching noise (SSN). The simultaneous switching noise can cause logic circuits to switch state falsely, and signal/power integrity issues have significant impacts on the performance of high-speed systems. The simultaneous switching can also cause problems in signal timing and quality such as signal degradation in rise time, signal channel transmission delay skew, and an increase in signal overshoot.

Use of a decoupling capacitor is one known technique of reducing the effects of undesirable simultaneous switching noise. Normally, the decoupling capacitor is mounted on a motherboard in the form of a discrete component, while being apart from the (IC) chip package. However, in high-speed, high-frequency systems, the decoupling capacitor is disposed within the IC chip package so as to reduce parasitic parameters caused by longer connection paths, thereby to improve electrical performance.

FIG. 1 shows, in a plan view, an internal structure of a conventional IC chip package 10 in which a decoupling capacitor 13 is disposed. FIG. 2 is a cross-sectional view taken along the line II-II of FIG. 1.

Referring to FIGS. 1 and 2, the package 10 has an IC chip 12 and the decoupling capacitor 13 attached side by side onto a circuit substrate 11. The decoupling capacitor 13 is electrically coupled to the IC chip 12 and to the circuit substrate 11 via bonding wires 14. A power/ground ring 15 is formed on the circuit substrate 11, surrounding the IC chip 12. The power/ground ring 15 is used to electrically connect, or merge a, number of power/ground pins. Although other bonding wires typically are formed to directly connect signal pins between the IC chip 12 and the circuit substrate 11, they are not depicted in the drawings for clarity of illustration.

Typically, the conventional package 10 may use a bulk capacitor, e.g. the decoupling capacitor 13, which is, for example, about 1 mm, 1 m, and 2 mm in width, length, and height, respectively. Thus, the bulk capacitor 13 occupies excessive internal space in the package 10, leading to increases in size of the package 10, especially its thickness or height. Furthermore, the conventional decoupling capacitor 13 is coupled to a single kind of power pins, so several capacitors 13 are needed depending on the kinds of power pins. Moreover, the mounting position of the capacitor 13 on the substrate is restricted according to that of the power/ground pins of the IC chip 12.

As described above, the conventional decoupling capacitor 13 uses the bonding wires 14 for electrical connections to both the IC chip 12 and the circuit substrate 11, thereby requiring double wire bonding. In addition, the capacitor 13 typically is greater than the IC chip 12 in height, so the bonding wires 14 coupled to the capacitor 13 increase in length and undesirable inductance. Also, the bonding wires 14 made of gold have a greater resonance peak causing the troublesome simultaneous switching noise.

SUMMARY

Exemplary, non-limiting embodiments of the invention provide an integrated circuit (IC) chip package that has a ring-shaped decoupling capacitor made of silicon using a wafer fabrication process.

According to one exemplary embodiment of the invention, the package comprises a circuit substrate having a top surface, a bottom surface, and a plurality of bond fingers formed on the top surface. The package further comprises at least one IC chip disposed on the top surface of the circuit substrate and having a plurality of first input/output (I/O) terminals and a plurality of second I/O terminals. Moreover, the package comprises a decoupling capacitor extending along a defined periphery around the IC chip on the top surface of the circuit substrate. The package also comprises a plurality of first bonding wires electrically coupling the first I/O terminals of the IC chip to the bond fingers of the circuit substrate, and a plurality of second bonding wires electrically coupling the second I/O terminals of the IC chip to the decoupling capacitor. In this package, the decoupling capacitor has a plurality of bond pads formed thereon and a plurality of connection vias formed therein. The bond pads are connected to the second bonding wires, and the connection vias electrically couple the bond pads to the top surface of the circuit substrate.

In the package, the bond pads of the decoupling capacitor typically have at least one power pad and a ground pad. Furthermore, the bond pads typically have a plurality of separate power pads and a plurality of separate ground pads, or alternatively, an elongate single power pad and an elongate single ground pad.

In the package, the second I/O terminals typically have a plurality of power pins and a plurality of ground pins. The second bonding wires may have a relatively higher specific resistance than do the first bonding wires. The second bonding wires may be made of an alloy of gold and aluminum.

The decoupling capacitor typically has a ring-like shape and may extend continuously along the circumference of the IC chip. Alternatively, the decoupling capacitor might have a ring-like configuration and might be divided into several units or linear or curvi-linear segments extending only partway along the defined periphery around the IC chip.

The thickness of the decoupling capacitor typically is less than or equal to that of the IC chip. The decoupling capacitor can be fabricated from silicon by using wafer fabrication process. The decoupling capacitor can have two or more polysilicon layers and one or more oxide-nitride-oxide layers interposed between the polysilicon layers.

Additionally, the IC chip can include two or more individual IC chips disposed in a stack. The package can further comprise a plurality of conductive balls formed on the bottom surface of the circuit substrate.

According to another exemplary embodiment of the present invention, the package comprises a circuit substrate having a top surface, a bottom surface, and a plurality of bond fingers formed on the top surface, at least one IC chip disposed on the top surface of the circuit substrate and having a plurality of first input/output (I/O) terminals and a plurality of second I/O terminals, and a decoupling capacitor having a plurality of bond pads formed thereon and extending along a defined periphery around the IC chip on the top surface of the circuit substrate. The package further comprises a plurality of first bonding wires electrically coupling the first I/O terminals of the IC chip to the bond fingers of the circuit substrate, and a plurality of second bonding wires electrically coupling the second I/O terminals of the IC chip to the bond pads of the decoupling capacitor. In this package, the second I/O terminals of the IC chip have a plurality of power pins and a plurality of ground pins, and the bond pads of the decoupling capacitor have at least one power pad and a ground pad.

In the package, the decoupling capacitor can further have a plurality of connection vias formed therein, the connection vias being electrically coupling the bond pads to the top surface of the circuit substrate. The second bonding wires can have a relatively higher specific resistance than the first bonding wires. Further, the second bonding wires can be made of an alloy of gold and aluminum.

The decoupling capacitor can have a ring-like shape and can extend contiguously along the circumference of the IC chip. Alternatively, the decoupling capacitor can have a ring-like configuration and can be divided or segmented into several units extending along the defined periphery around the IC chip.

The thickness of the decoupling capacitor can be less than or equal to that of the IC chip. The decoupling capacitor can be fabricated from silicon by using wafer fabrication process. The decoupling capacitor can have two or more polysilicon layers and one or more oxide-nitride-oxide layers interposed between the polysilicon layers. The IC chip can include two or more individual IC chips disposed in a stack. The package can further comprise a plurality of conductive balls formed on the bottom surface of the circuit substrate.

DETAILED DESCRIPTION

Figure 1:
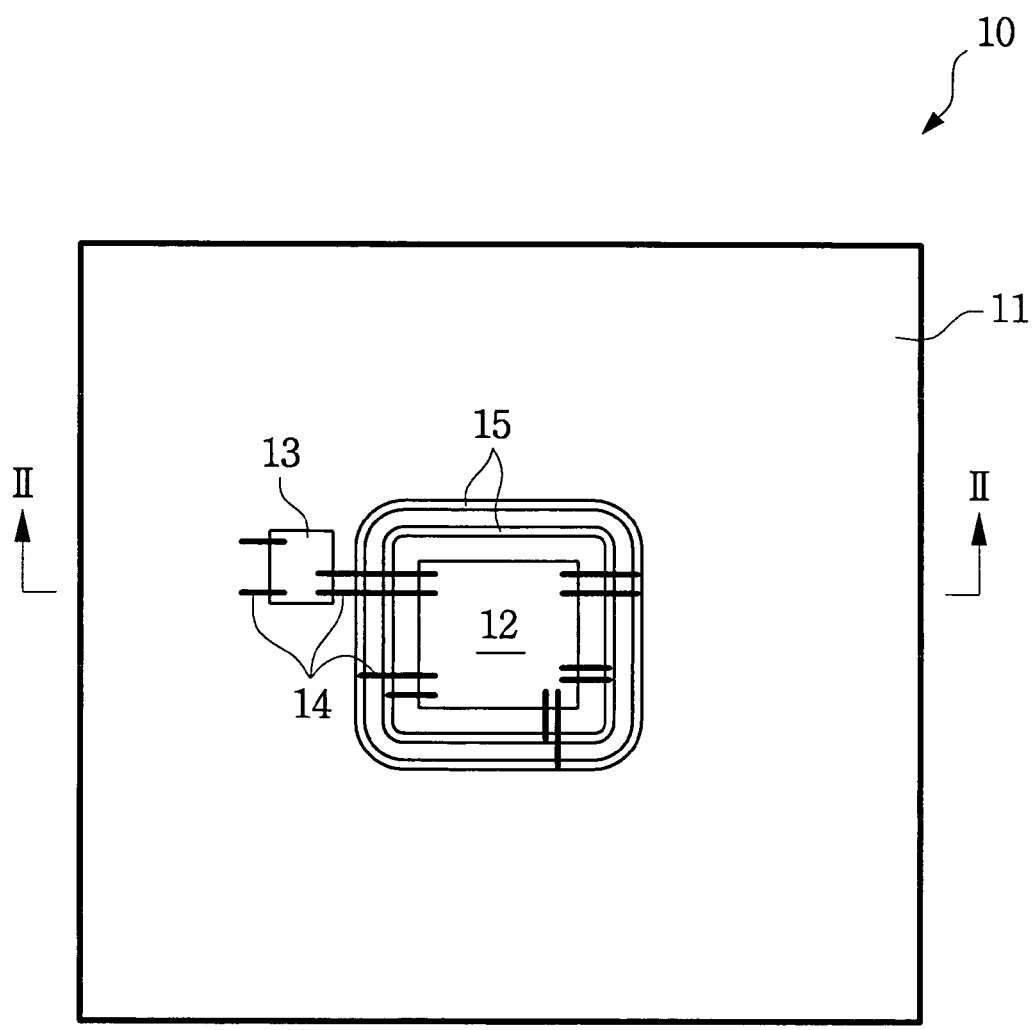
FIG. 1 is a plan view showing an internal structure of a conventional IC chip package.
Figure 2:
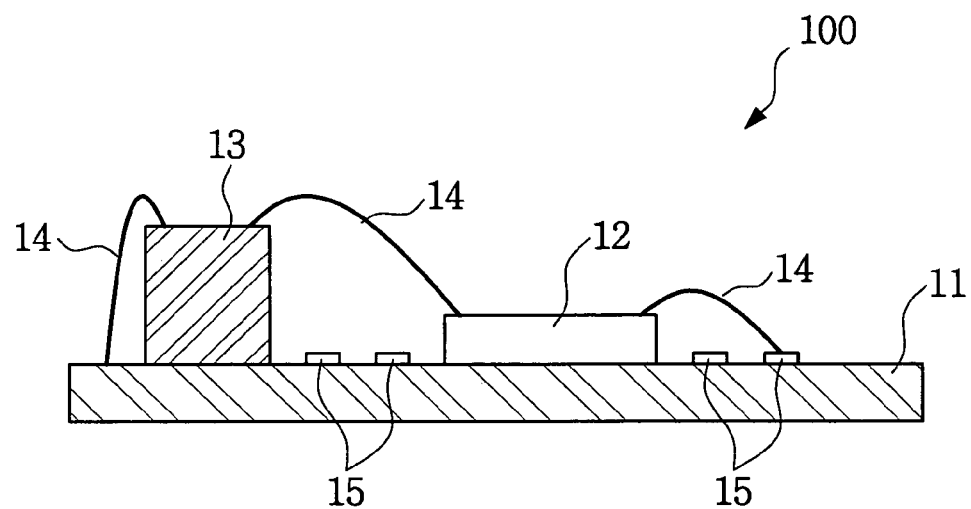
FIG. 2 is a cross-sectional view taken along the line II-II of FIG. 1.

Exemplary, non-limiting embodiments of the invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

In is noted that well-known structures and processes are not described or illustrated in detail to avoid obscuring the essence of the invention. It is also noted that the figures are not drawn to scale. Rather, for simplicity and clarity of illustration, the dimensions of some of the elements are exaggerated relative to other elements. Like reference numerals are used for like and corresponding parts of the various drawings.

Figure 3:
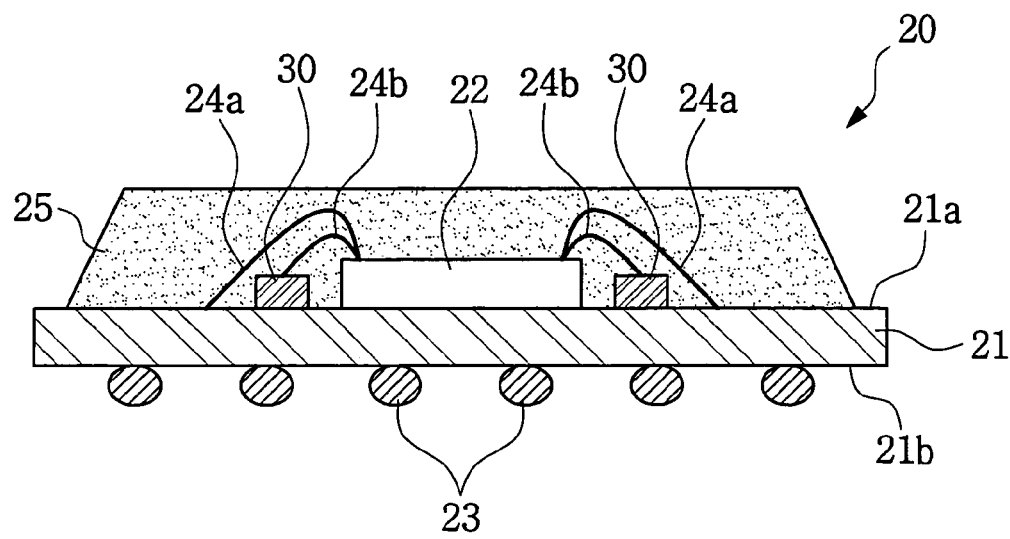
FIG. 3 is a cross-sectional view showing an IC chip package having a ring-shaped silicon decoupling capacitor in accordance with an exemplary embodiment of the present invention.

FIG. 3 shows, in a cross-sectional view, an IC chip package 20 having a ring-shaped silicon decoupling capacitor 30 in accordance with an exemplary embodiment of the present invention.

Referring to FIG. 3, the package 20 has an IC chip 22 and the decoupling capacitor 30 both of which are disposed on a top surface 21a of a circuit substrate 21. The package has also a plurality of conductive balls 23 disposed on a bottom surface 21b of the circuit substrate 21. The IC chip 22 is electrically coupled to the circuit substrate 21 via first bonding wires 24a and to the decoupling capacitor 30 via second bonding wires 24b. The IC chip 22, the decoupling capacitor 30, and the first and second bonding wires 24a and 24b are encapsulated in a molding resin 25.

Figure 4:
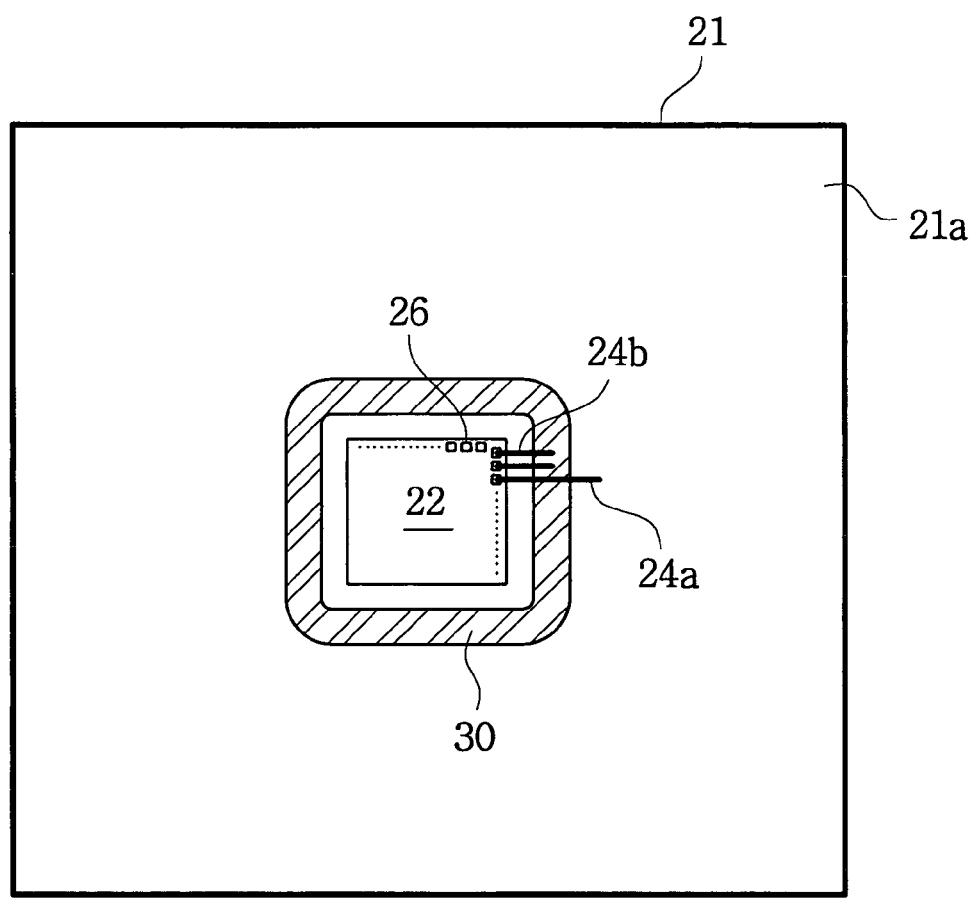
FIG. 4 is a plan view showing the configuration of the decoupling capacitor in the package shown in FIG. 3.

FIG. 4 shows, in a plan view, the configuration of the decoupling capacitor 30 in the package shown in FIG. 3. As shown in FIG. 4, the decoupling capacitor 30 has a ring-like shape, extending contiguously along a defined periphery around the IC chip 22. That is, the decoupling capacitor 30 is disposed at the substantially same position where a conventional power/ground ring typically would have been formed. In addition, the decoupling capacitor 30 functions as the above-described conventional power/ground ring, as will be described later. Accordingly, though disposed within the package, the decoupling capacitor 30 does not increase the size of the package. It will be appreciated that FIG. 4 does not illustrate circuit patterns, including bond fingers, formed on the top surface 21a of the circuit substrate 21 for the sake of simplicity and clarity of illustration.

It will be appreciated that, within the spirit and scope of the invention, decoupling capacitor 30 can extend only partway around the defined periphery of the IC chip 22, as discussed below with reference to FIG. 9.

The IC chip 22 has a plurality of input/output (I/O) terminals 26, also referred to as I/O pads or bond pads. The I/O terminals 26 are broadly classified into signal pins, power pins and ground pins, according to their functions. The power pins include AC power pins and DC power pins, and further, the AC pins can carry various AC voltages. The I/O terminals have different wire-bonding schemes, also according to their functions.

Figure 5:
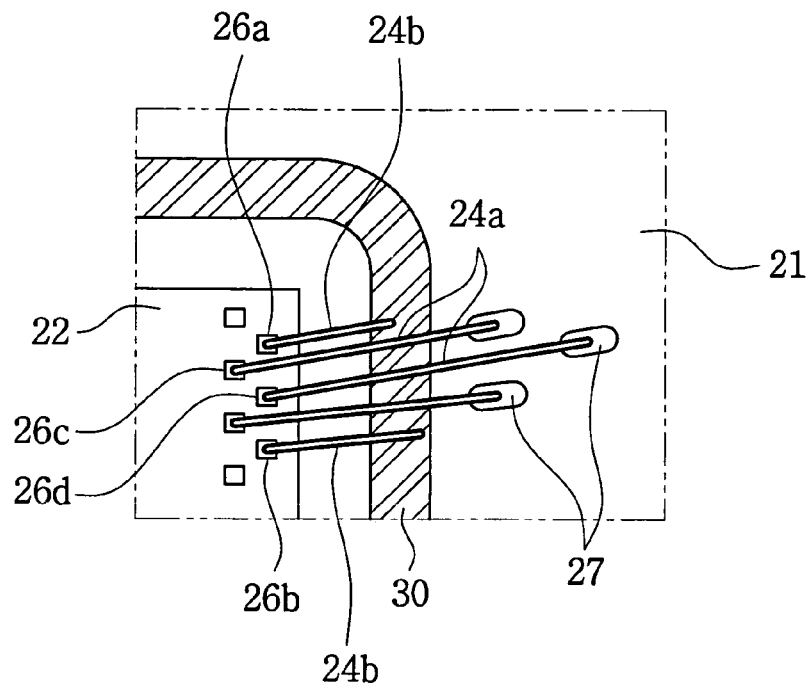
FIG. 5 is a plan view showing a wire-bonding scheme of the package shown in FIG. 3.

FIG. 5 shows, in a plan view, a wire-bonding scheme of the package shown in FIG. 3. Referring to FIG. 5, a first I/O terminal 26a functioning as an AC power pin is coupled to the decoupling capacitor 30 through a second bonding wire 24b. Similarly, a second I/O terminal 26b functioning as a ground pin is coupled to the decoupling capacitor 30 through a second bonding wire 24b. A third I/O terminal 26c, functioning as a signal pin, and a fourth I/O terminal 26d, functioning as a DC power pin, are respectively coupled to the bond fingers 27 on the circuit substrate 21 through first bonding wires 24a.

While the first bonding wires 24a can be made of gold (Au), the second bonding wires 24b may be made of an alloy of gold (Au) and other metal, e.g. aluminum (Al), having a relatively higher specific resistance. For example, gold and aluminum can be mixed with a ratio of 1 to 1. Higher specific resistance of the second bonding wires 24b tends to lower the peak of the resonance frequency, thus reducing the simultaneous switching noise.

The I/O terminals 26 on the IC chip 22 may be arranged in one row as shown in FIG. 4, or alternatively in two rows as shown in FIG. 5. However, these arrangements are exemplary only and not to be considered as a limitation of exemplary embodiments of the present invention.

The decoupling capacitor 30 is fabricated from silicon (Si) by using the well-known wafer fabrication process. This makes it possible not only to form a variety of bond pads for various AC power pins on the decoupling capacitor 30, but also to decrease the thickness of the decoupling capacitor 30 on a chip level.

Figure 6:
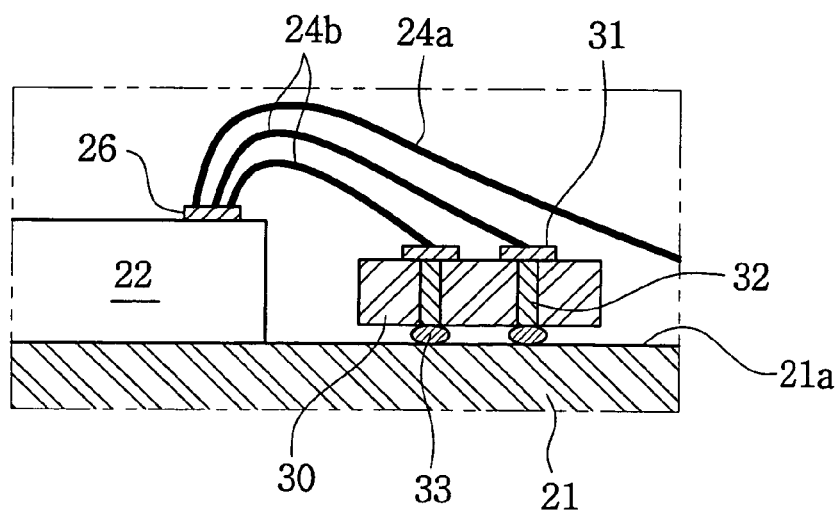
FIG. 6 is an enlarged, fragmentary view corresponding with FIG. 3.

FIG. 6 is an enlarged, fragmentary view corresponding with FIG. 3. As shown in FIG. 6, the decoupling capacitor 30 is located in very close proximity to the IC chip 22 since it takes the place of a conventional power/ground ring. Furthermore, the decoupling capacitor 30 has a reduced thickness on or below a chip level in comparison with a conventional bulk decoupling capacitor. Therefore, the bond pad 31 on the decoupling capacitor 30 becomes much closer to the I/O terminal 26 on the IC chip 22, so the length of the second bonding wire 24b can be significantly shortened.

Additionally, the wafer fabrication process may form one or more connection vias such as via 32 within the decoupling capacitor 30. The connection via 32 provides a direct electrical path between top and bottom of the decoupling capacitor 30: With the connection via 32, the decoupling capacitor 30 does not require a conventional double wire bonding. Accordingly, the entire electrical path passing through the decoupling capacitor 30 is significantly shortened, and related inductance is favorably reduced. The connection via 32 may be electrically coupled (directly or indirectly) to the top surface 21a of the circuit substrate 21, for example, through a solder 33.

Figure 7:
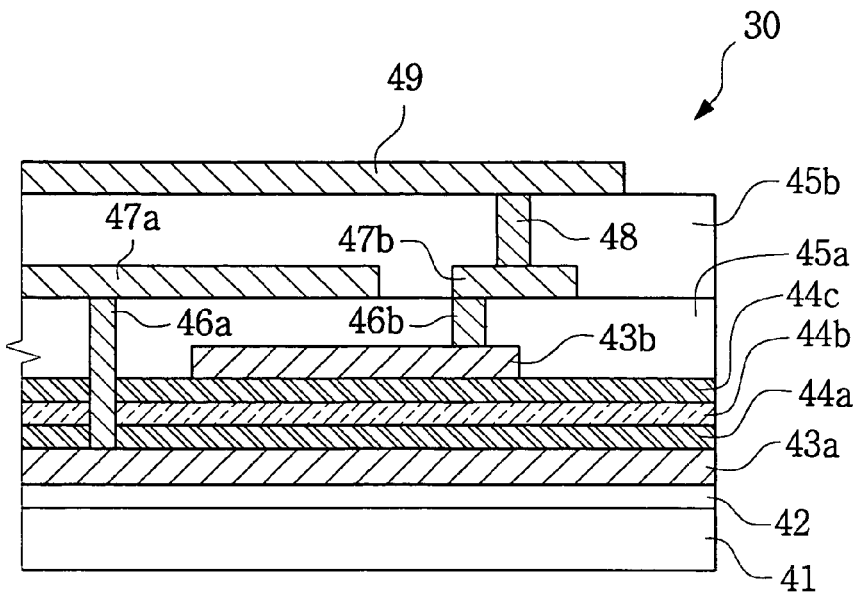
FIG. 7 is a cross-sectional view showing the layered structure of a silicon decoupling capacitor in accordance with an exemplary embodiment of the present invention.

As discussed above, the decoupling capacitor 30 can be fabricated from silicon (Si) by using the wafer fabrication process. FIG. 7 shows, in a cross-sectional view, the layered structure of the silicon decoupling capacitor 30. However, the layered structure in FIG. 7 is presented by way of illustration only, and not as a limitation of the invention.

Referring to FIG. 7, after a first oxide layer 42 is formed on a silicon substrate 41, a first polysilicon layer 43a is deposited thereon. Next, a second oxide layer 44a, a nitride layer 44b and a third oxide layer 44c are deposited in sequence, and then a second polysilicon layer 43b is deposited thereon. Two polysilicon layers 43a and 43b act as conductive layers, whereas the interposed oxide-nitride-oxide layers 44a, 44b and 44c act as dielectric layers. That is, a capacitor structure is created. In this structure, the first polysilicon layer 43a may be used as a ground plane (Vss), and the second polysilicon layer 43b may be used as a power plane (Vdd).

The second polysilicon layer 43b is then patterned so as to form several capacitor blocks. Next, a first interlayer dielectric layer 45a is coated. The first interlayer dielectric layer 45a, the third oxide layer 44c, the nitride layer 44b and the second oxide layer 44a are selectively etched in sequence to form contacts 46a and 46b respectively connected with the first and second polysilicon layers 43a and 43b.

Thereafter, a first metal layer 47a and 47b are deposited on the first interlayer dielectric layer 45a and patterned to be connected with the respective contacts 46a and 46b. Then the second interlayer dielectric layer 45b is coated thereon and selectively etched to form a via 48. Next, a second metal layer 49 is deposited thereon to be connected with the via 48. Next, a passivation layer (not shown) is coated thereon and selectively etched to define the aforementioned bond pad (31 in FIG. 6). The above-discussed connection vias 32 in FIG. 6 thus can be formed in the layered structure in FIG. 7 under the first metal layer 47a and 47b and/or the second metal layer 49.

Figure 8:
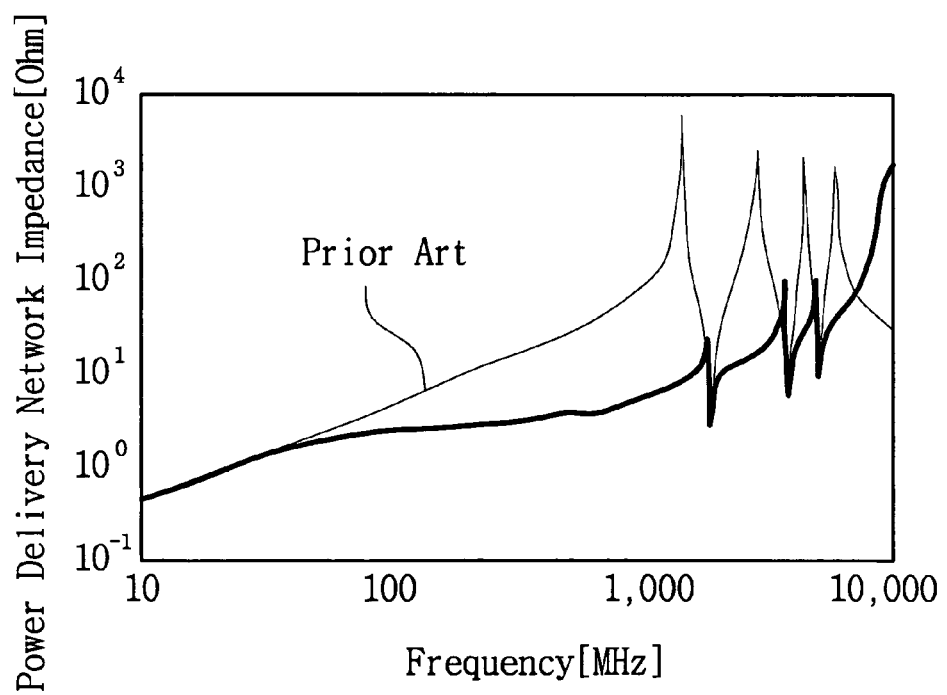
FIG. 8 is a graph showing the simulation results using the silicon decoupling capacitor in accordance with an exemplary embodiment of the present invention.

FIG. 8 is a graph showing the simulation results in accordance with an exemplary embodiment of the present invention and a conventional technique. A graph of FIG. 8 indicates power delivery network impedance (vertical axis) relative to frequency (horizontal axis). Those of skill in the art will appreciate that the impedance can be measured at the power/ground terminals and that the resulting impedance curve effectively represents the inverse of power delivery efficiency, i.e. the lower the impedance the higher the power delivery efficiency.

The prior art simulation used the power/ground ring (15 shown in FIG. 1) but did not use the bulk decoupling capacitor (13 shown in FIG. 1). The invention simulation used the ring-shaped silicon decoupling capacitor (30 shown in FIG. 4) and the second bonding wires (24b shown in FIG. 4) containing aluminum. While a conventional power/ground ring has an overall width of about 1500 μm, the silicon decoupling capacitor of the invention has a width of about 1000 μm and a capacitance of about 30 nF. As shown by the bold curve representing the invention simulation in FIG. 8, the resonance peak was significantly lowered at frequencies over approximately 100 MHz. This high frequency range, of course, is the range of interest in high-speed, high-frequency switching circuit fabrication, packaging and mounting.

Figure 9:
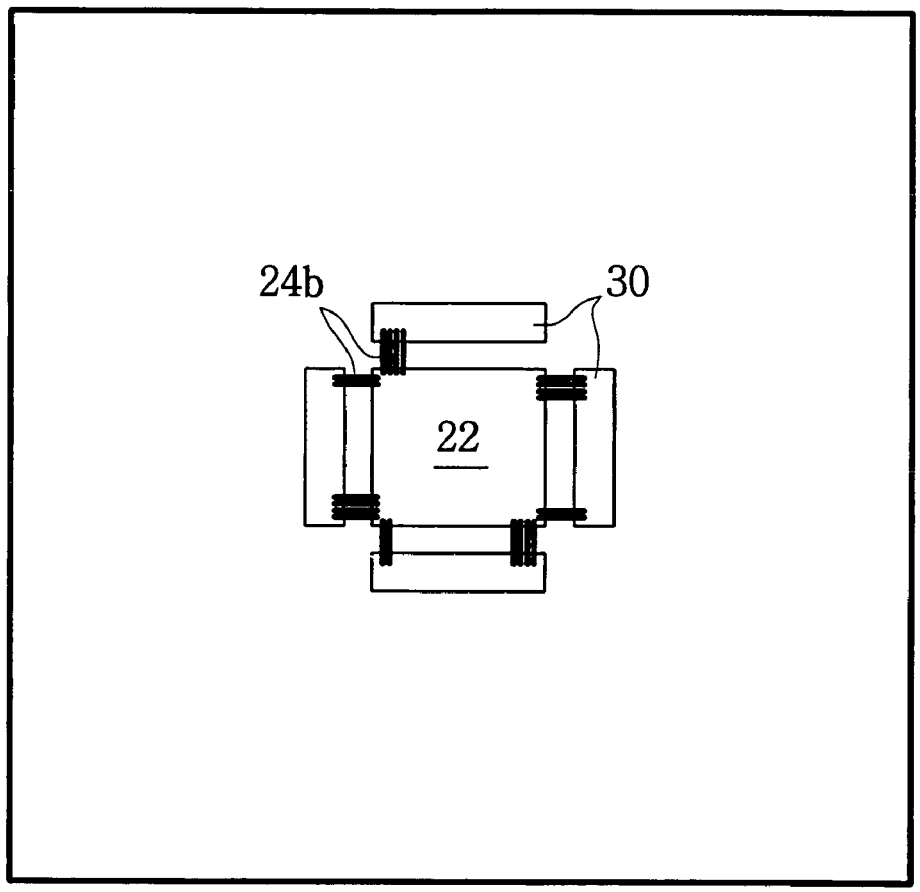
FIG. 9 is a plan view showing a ring-shaped silicon decoupling capacitor in accordance with another exemplary embodiment of the present invention.

FIG. 9 shows, in a plan view, a ring-shaped silicon decoupling capacitor 30 in accordance with another exemplary embodiment of the present invention.

Referring to FIG. 9, the decoupling capacitor 30 in this embodiment has a ring-like configuration and is fabricated using the wafer fabrication process. Contrary to the previous embodiment, the decoupling capacitor 30 in this embodiment is divided into several units or segments arranged to extend partway (and, in accordance with a preferred embodiment of the invention, substantially but not entirely contiguously) along a circumference of (or defined periphery around of) the IC chip 22.

Figure 10A:
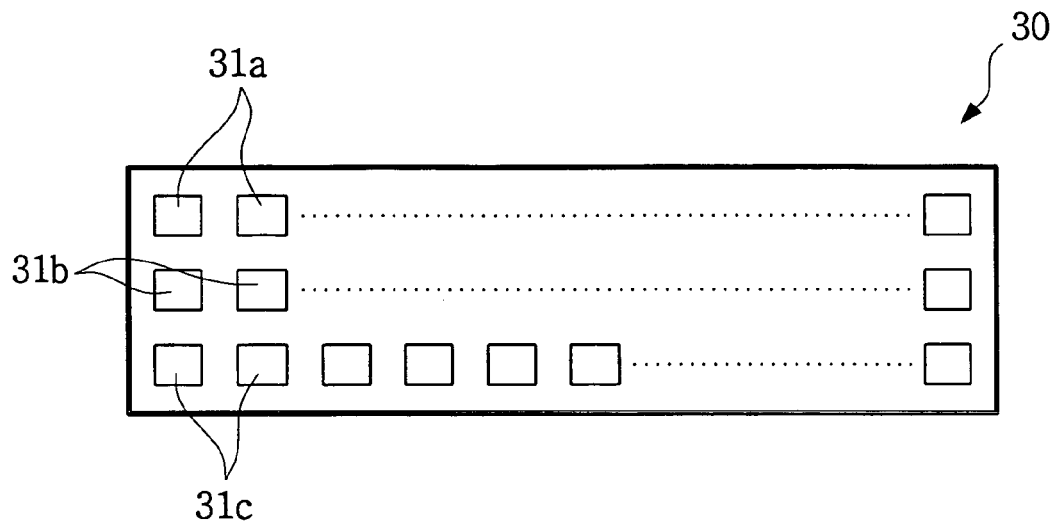
FIGS. 10A and 10B are plan views showing two examples of bond pads on the decoupling capacitor shown in FIG. 9.
Figure 10B:
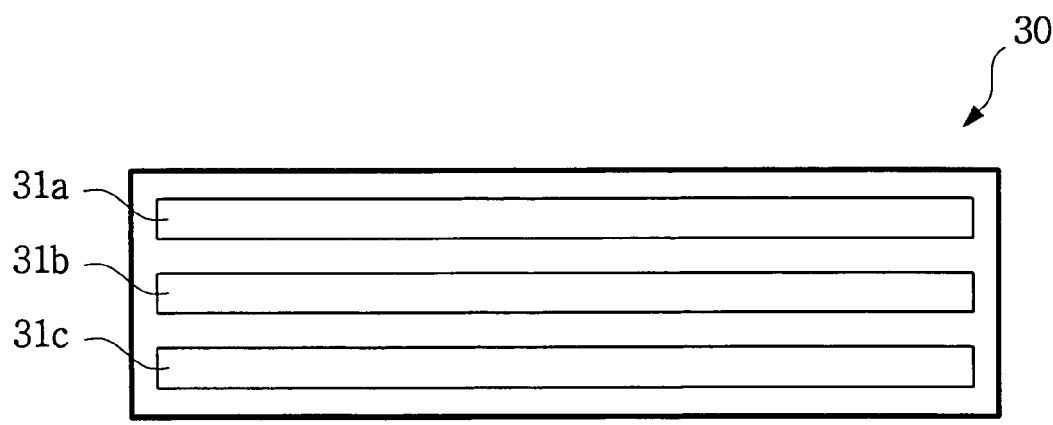

FIGS. 10A and 10B respectively show, in plan views, two examples of bond pads 31 on the decoupling capacitor 30 shown in FIG. 9. As discussed above, the bond pads 31 of the decoupling capacitor 30 are electrically coupled to the AC power pins and the ground pins of the IC chip. The examples of the bond pads 31 shown in FIGS. 10A and 10B are exemplary only and should not be considered as a limitation of the invention.

Referring to FIG. 10A, the bond pads of this decoupling capacitor 30 have a plurality of first AC power pads 31a, a plurality of second AC power pads 31b, and a plurality of ground pads 31c. The first and second AC power pads 31a and 31b are electrically coupled to different voltage AC pins of the IC chip. Such configuration of separate bond pads may be available when the IC chip has a great number of power/ground pins. That is, the respective pins of the IC chip can be wire-bonded to the nearest bond pads, thus allowing optimum wire bonding, e.g. the shortest practical bond wire paths with the least practical characteristic inductance.

Referring to FIG. 10B, the bond pads of this decoupling capacitor 30 have an elongated single first AC power pad 31a, an elongated single second AC pad 31b, and an elongated single ground pad 31c. Such configuration of united bond pad may be available for taking the place of a power/ground ring.

Figure 11:
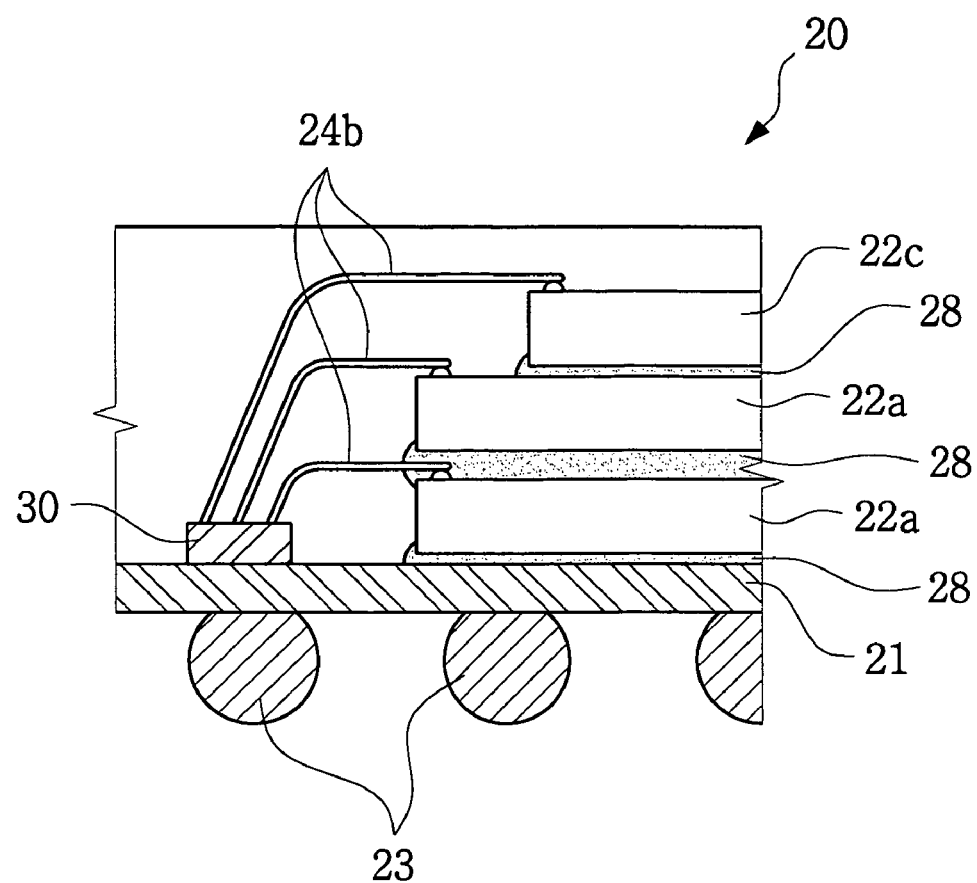
FIG. 11 is a fragmentary, cross-sectional view showing an IC chip package having a decoupling capacitor in accordance with still another exemplary embodiment of the present invention.

The silicon decoupling capacitor of this invention may be helpfully used for a system-in-package (SIP). The following FIG. 11 illustrates such a case in point. FIG. 11 is a fragmentary, cross-sectional view showing an IC chip package 20 having a decoupling capacitor 30 in accordance with still another exemplary embodiment of the present invention.

Referring to FIG. 11, the package 20 has several IC chips 22a, 22b and 22c, which are disposed in a stack on the circuit substrate 21. The IC chips 22a, 22b and 22c may be memory chips and/or logic chips. Adhesive material 28 is interposed between the lowermost IC chip 22a and the circuit substrate 21 and between the adjacent IC chips 22a, 22b and 22c. A number of conductive balls 23, such as solder balls, are formed under the circuit substrate 21.

The silicon decoupling capacitor 30 is located in close proximity to the chip stack on the circuit substrate 21. As discussed above, the decoupling capacitor 30 has a ring-like shape or a ring-like configuration, whether contiguous or segmented. The power/ground pins of the respective IC chips 22a, 22b and 22c are electrically coupled to the decoupling capacitor 30 through the second bonding wires 24b having higher specific resistance.

As fully discussed hereinbefore, the decoupling capacitor according to the present invention can be employed regardless of types of the packages. Moreover, the decoupling capacitor can be fabricated from silicon using the wafer fabrication process. The silicon decoupling capacitor can have a reduced thickness on or below a chip level, so the thickness of the package may not increase due to the decoupling capacitor. Furthermore, since the silicon decoupling capacitor can take the place of a conventional power/ground ring, the decoupling capacitor can be included within the package without increasing the size of the package.

Additionally, the decoupling capacitor not only provides effective connections with various power pins, but it also allows respective optimum wire bonding connections according to the locations of the power/ground pins of the IC chip. The decoupling capacitor thus further allows shortened electrical connections, e.g. wire bond paths, and hence reduced inductance.

Besides, the decoupling capacitor and the AC power pins can be coupled through the second bonding wires having higher specific resistance, which lowers the peak of the resonance frequency and thereby reduces the troublesome simultaneous switching noise.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An integrated circuit (IC) chip package comprising:
   a circuit substrate including a top surface, a bottom surface, and a plurality of bond fingers formed on the top surface;
   at least one IC chip disposed on the top surface of the circuit substrate and including a plurality of first input/output I/O terminals and a plurality of second I/O terminals;
   a decoupling capacitor extending at least partway along a defined periphery around the IC chip on the top surface of the circuit substrate;
   a plurality of first bonding wires electrically coupling the first I/O terminals of the IC chip to the bond fingers of the circuit substrate; and
   a plurality of second bonding wires electrically coupling the second I/O terminals of the IC chip to the decoupling capacitor,
   wherein the decoupling capacitor includes a plurality of bond pads formed thereon and a plurality of connection vias formed therein, wherein the bond pads are connected to the second bonding wires, and wherein the connection vias electrically couple the bond pads to the top surface of the circuit substrate.

2. The package of claim 1, wherein the bond pads of the decoupling capacitor include at least one power pad and a ground pad.

3. The package of claim 2, wherein the bond pads include a plurality of separate power pads and a plurality of separate ground pads.

4. The package of claim 2, wherein the bond pads include an elongate single power pad and an elongate single ground pad.

5. The package of claim 1, wherein the second I/O terminals include a plurality of power pins and a plurality of ground pins.

6. The package of claim 1, wherein the second bonding wires include a relatively higher specific resistance than the first bonding wires.

7. The package of claim 6, wherein the second bonding wires are made of a material containing an alloy of gold and aluminum.

8. The package of claim 1, wherein the decoupling capacitor includes a ring-like shape and extends contiguously along the defined periphery.

9. The package of claim 1, wherein the decoupling capacitor includes a ring-like configuration and is divided into two or more segments arranged along the defined periphery.

10. The package of claim 1, wherein the thickness of the decoupling capacitor is not greater than that of the IC chip.

11. The package of claim 1, wherein the decoupling capacitor is fabricated from silicon by using a wafer fabrication process.

12. The package of claim 1, wherein the decoupling capacitor includes two or more polysilicon layers and one or more oxide-nitride-oxide layers interposed between adjacent ones of the two or more polysilicon layers.

13. The package of claim 1, wherein the IC chip includes two or more individual IC chips disposed in a stack.

14. The package of claim 1 which further comprises:
   a plurality of conductive balls formed on the bottom surface of the circuit substrate.

15. An integrated circuit (IC) chip package comprising:
   a circuit substrate including a top surface, a bottom surface, and a plurality of bond fingers formed on the top surface;

at least one IC chip disposed on the top surface of the circuit substrate and including a plurality of first input/output (I/O) terminals and a plurality of second I/O terminals;

a decoupling capacitor including a plurality of bond pads formed thereon and extending at least partway along a defined periphery around the IC chip on the top surface of the circuit substrate;

a plurality of first bonding wires electrically coupling the first I/O terminals of the IC chip to the bond fingers of the circuit substrate; and a plurality of second bonding wires electrically coupling the second I/O terminals of the IC chip to the bond pads of the decoupling capacitor, wherein the second I/O terminals of the IC chip include a plurality of power pins and a plurality of ground pins, and wherein the bond pads of the decoupling capacitor include at least one power pad and a ground pad.

16. The package of claim 15, wherein the decoupling capacitor further includes a plurality of connection vias formed therein, the connection vias electrically coupling the bond pads to the top surface of the circuit substrate.

17. The package of claim 15, wherein the second bonding wires include a relatively higher specific resistance than the first bonding wires.

18. The package of claim 17, wherein the second bonding wires are made of a material containing an alloy of gold and aluminum.

19. The package of claim 15, wherein the decoupling capacitor includes a ring-like shape extending contiguously along the defined periphery.

20. The package of claim 15, wherein the decoupling capacitor includes a ring-like configuration and is divided into two or more segments arranged along the defined periphery.

21. The package of claim 15, wherein the thickness of the decoupling capacitor is not greater than that of the IC chip.

22. The package of claim 15, wherein the decoupling capacitor is fabricated from silicon by using a wafer fabrication process.

23. The package of claim 15, wherein the decoupling capacitor includes two or more polysilicon layers and one or more oxide-nitride-oxide layers interposed between adjacent ones of the two or more polysilicon layers.

24. The package of claim 15, wherein the IC chip includes at least two individual IC chips disposed in a stack.

25. The package of claim 15 which further comprises:
a plurality of conductive balls formed on the bottom surface of the circuit substrate.

26. A method for manufacturing a semiconductor package, the method comprising:
preparing a circuit substrate including a top surface including a plurality of bond fingers formed thereon;

mounting an integrated circuit (IC) chip on the top surface of the circuit substrate, the IC chip including one or more ground/power wire bond pads;

fabricating on the circuit substrate an integral annular structure that extends substantially around the periphery of the IC chip, the annular structure including a characteristic capacitance configured to decouple the IC chip from one or more ground/power terminal connections within the substrate, the annular structure further including one or more bond wire pads to define an integrated annular decoupling capacitor; and affixing one or more bond wires to electrically connect the one more ground/power wire bond pads of the IC chip with corresponding one or more bond wire pads of the annular structure, the affixing being performed in such a manner that the one or more ground/power terminals of the IC chip are indirectly electrically connected to the one or more ground/power terminal connections with the substrate through the integrated annular decoupling capacitor defined by the annular structure, wherein the IC chip further includes one or more signal wire bond pads, which further comprises:

affixing one or more second bond wires to electrically connect the one or more signal wire bond pads to the one or more bond fingers of the circuit substrate.

27. The method of claim 26, wherein the mounting is of two or more stacked integrated circuit (IC) chips.

28. The method of claim 26, wherein the fabricating includes stacking two or more polysilicon layers and one or more oxide-nitride-oxide layers interposed between adjacent ones of the two or more polysilicon layers.

29. The method of claim 26 which further comprises:
mounting a plurality of conductive balls on a bottom surface of the circuit substrate opposite the front surface.

* * * * *

UNITED STATES PATENT AND TRADEMARK OFFICE
CERTIFICATE OF CORRECTION

PATENT NO. : 7,489,035 B2
APPLICATION NO. : 11/258672
DATED : February 10, 2009
INVENTOR(S) : Eun-Seok Song et al.

It is certified that error appears in the above-identified patent and that said Letters Patent is hereby corrected as shown below:

Column 8, line 7, the words "output I/O" should read -- output (I/O) --.

Signed and Sealed this

Twenty-fourth Day of November, 2009

David J. Kappos
*Director of the United States Patent and Trademark Office*